US005793192A

United States Patent [19]
Kubly et al.

[11] Patent Number: 5,793,192
[45] Date of Patent: Aug. 11, 1998

[54] METHODS AND APPARATUSES FOR CLAMPING AND DECLAMPING A SEMICONDUCTOR WAFER IN A WAFER PROCESSING SYSTEM

[75] Inventors: Marc B. Kubly, Fremont; Neil Martin Paul Benjamin, Palo Alto; Steven Douglas Germain, Fremont, all of Calif.

[73] Assignee: Lam Research Corporation, Fremont, Calif.

[21] Appl. No.: 671,752

[22] Filed: Jun. 28, 1996

[51] Int. Cl.⁶ .............................. G05F 3/04; H01G 23/00; B23B 5/22
[52] U.S. Cl. ........................ 323/312; 361/234; 279/128
[58] Field of Search ........................... 361/234; 279/128; 323/312

[56] References Cited

U.S. PATENT DOCUMENTS

| | | | |
|---|---|---|---|
| 5,117,121 | 5/1992 | Watanabe et al. | 307/130 |
| 5,325,261 | 6/1994 | Horwitz | 361/234 |
| 5,444,597 | 8/1995 | Blake et al. | 361/234 |
| 5,535,090 | 7/1996 | Sherman | 361/234 |
| 5,535,507 | 7/1996 | Barnes et al. | 361/234 |
| 5,539,609 | 7/1996 | Collins et al. | 361/234 |
| 5,573,981 | 11/1996 | Sato | 361/234 |
| 5,583,737 | 12/1996 | Collins et al. | 361/234 |
| 5,612,850 | 3/1997 | Birange et al. | 361/234 |

*Primary Examiner*—Peter S. Wong
*Assistant Examiner*—Bao Q. Vu
*Attorney, Agent, or Firm*—Beyer & Weaver, LLP.

[57] ABSTRACT

A method for clamping a wafer to an electrostatic chuck having a substantially resistive dielectric layer disposed thereon. The method includes the step of providing a build-up voltage having a first polarity to a pole of the electrostatic chuck to cause a potential difference to build up between a first region of the substantially resistive dielectric layer and a second region of the wafer that overlies at least a portion of the first region. This potential difference gives rise to a clamping force to clamp the wafer to the electrostatic chuck. The method further includes the step of terminating the build-up voltage when the clamping force substantially reaches a predefined level. There is further included the step of providing a holding voltage to the pole of the electrostatic chuck to substantially maintain the clamping force at the predefined level. This holding voltage has the first polarity and a magnitude that is lower than a magnitude of the build-up voltage. There is further included the step of providing a declamping voltage to the pole of the electrostatic chuck to substantially remove the clamping force, the declamping voltage having a polarity that is opposite to the first polarity.

28 Claims, 6 Drawing Sheets

METHODS AND APPARATUSES FOR CLAMPING AND DECLAMPING A SEMICONDUCTOR WAFER IN A WAFER PROCESSING SYSTEM

BACKGROUND OF THE INVENTION

The present invention relates to the manufacture of semiconductor devices. More specifically, the present invention relates to improved methods and apparatuses for electrostatically clamping and declamping a semiconductor wafer on an electrostatic chuck in a processing chamber of a semiconductor wafer processing system.

The use of electrostatic chucks in wafer processing systems is known. For illustrative purposes, FIG. 1 shows an exemplary plasma processing system 100, representing a wafer processing system which may be used for etching, oxidation, annodization, chemical vapor deposition (CVD), and other processes associated with the manufacture of semiconductor wafers. It should be borne in mind that although an exemplary plasma processing system 100 is described in detail herein to facilitate understanding of the advantages of the present invention, the invention itself is not limited to any particular type of wafer processing apparatus and may be adapted for use in any of the known wafer processing systems, including but not limited to those adapted for deposition, oxidation, annodization, etching (including dry etching, plasma etching, reactive ion etching (RIE), magnetically enhanced reactive ion etching (MERIE), electron cyclotron resonance (ECR)), or the like.

As depicted, plasma processing system 100 typically includes a plasma processing chamber 102, a first radio frequency (RF) power supply 104, and a second RF power supply 106. Within plasma processing chamber 102, there may be disposed a shower head 110 and an electrostatic chuck 112. Shower head 110 is typically employed to distribute source etchant gases into a plasma region 103 of plasma processing chamber 102 and may be made of a non-conductive material such as quartz.

When one or both of RF power supplies 104 and 106 are energized, a plasma is created within plasma region 103 out of the source etchant gases. A wafer 108 is disposed atop electrostatic chuck 112 to be processed by the plasma. Electrostatic chuck 112 may be made of a suitable conductive material, such as an aluminum alloy, and may have any number of configurations, including the monopolar and bipolar configurations. At the top surface of electrostatic chuck 102, there is typically disposed a dielectric layer 116. Between electrostatic chuck 102 and wafer 108, a heat transfer gas, e.g., helium, may be provided under pressure via a port 109 to the wafer/chuck interface. The heat transfer gas act as a heat transfer medium between wafer 108 and electrostatic chuck 102 to facilitate control of the wafer temperature during processing.

As the term is used herein, an electrostatic chuck is said to have a monopolar configuration when it has only a single pole. Bipolar chucks, on the other hand, have two poles. In the example of FIG. 1, electrostatic chuck 102 represents a bipolar chuck having a donut-and-base configuration, i.e., having a torroid-shaped pole embedded within and electrostatically insulated from a base pole. Other bipolar chuck configurations also exist, e.g., including a third electrode which may be floating, grounded, or insulated. By way of example, FIG. 2 depicts an alternative configuration known as an interdigitated or comb configuration wherein the poles appear interwoven when viewed from the top.

To securely clamp wafer 108 to electrostatic chuck 102 during processing, electrostatic forces are induced by a direct current power supply 114. For the exemplary bipolar chuck 102 of FIG. 1, poles 115A and 115B may be biased with direct current potentials having opposite polarities. For example, pole 115A may be biased positively and pole 115B may be biased negatively, or vice versa. The direct current potential in each electrostatic pole creates a potential difference between the top surface of the pole and the corresponding overlying region in the bottom surface of the wafer, thereby generating an electrostatic force to hold the wafer to the electrostatic chuck.

In the prior art, some dielectric layer 116 may be formed of a substantially resistive dielectric material. Such a substantially resistive dielectric layer exhibits a Johnson-Rahbeck effect when the poles of its associated electrostatic chuck are biased with direct current potentials. In general, an electro-static clamp effect requires a force to be built up across the interface between the chuck surface and the wafer which is clamped to it. The electric field can be applied between the single pole electrode, if a monopolar chuck is employed, via an insulating dielectric layer and the interface gap to the wafer. In such a system, the charging circuit is completed via the plasma.

In the monopolar configuration, charges are generally added or removed while the plasma is present. In addition if as is commonly the case, the plasma causes a differential d.c. bias between surfaces with which it is in contact, then that bias may act to modify, e.g., either increasing or decreasing, the electric field in the gap, and hence the clamping force. In order to reduce this effect, it is usual to compensate the applied clamping potential to maintain the electric field at a desired level.

A bipolar chuck is constructed by having the chuck electrode area split in two electrodes such that a differential potential can be applied without a plasma present. It is preferable that the wafer be somewhat conductive to allow the induction charge to be redistributed between the two poles. Further, the two poles may be equal in area, e.g., in a balanced configuration, to equalize the electric fields exerted by the poles. However, the electric field exerted by the poles of the bipolar chuck configuration may also be modified and may become unbalanced due to the d.c. bias that is present when the plasma is turned on. In this case, for example, the electro-static force exerted by one pole may be greater than that exerted by the other pole of the bipolar chuck. Consequently, bias compensation is also desired in the bipolar chuck configuration.

Johnson-Rahbeck chucks may be of a monopolar or a bipolar configuration, and are typically constructed using a semi-conductive layer instead of the conventional high resistivity dielectric. With a conventional high resistivity dielectric layer, the potential is divided across the dielectric layer and the interface gap, such that only a fraction of the potential appears at the surface of the chuck, and therefore the electric field may be substantially reduced below the maximum possible. The clamping force is still further reduced because it typically scales as the square of the electric field.

When the potential is charged across a Johnson-Rahbeck dielectric layer, a current flows. In the context of a chuck system, this enables the charge to migrate to the dielectric-wafer interface. Consequently, the electric field and the clamping force are increased as a function of time. The increase typically occurs with a time constant that is proportional to the dielectric resistance and the wafer-to-chuck capacitance, which is being charged up. This process accounts for the high clamping force of a Johnson-Rahbeck chuck as well as its susceptibility to wafer sticking.

Wafer sticking occurs when residual charge is left on the chuck dielectric or the wafer surface leading to undesired electric field and clamping force. This may arise because of uncompensated d.c. bias and/or charge accumulated on the chuck surface or on the wafer due to excessive local field, which may cause field emission tunneling across the interface gap. Generally, charge is gradually bled away from a Johnson-Rahbeck chuck with the same time constant it was charged up with. However, if charge migrates to the back of a dielectric coated wafer on a Johnson-Rahbeck chuck, the resulting residual charge may be very difficult to remove. These causes of sticking may be exacerbated by spatial non-uniformity, thereby potentially causing one area to stick while another releases or vice versa.

FIG. 3 illustrates in greater detail wafer 108 and electrostatic chuck 1 12 of FIG. 1, including poles 115A and 115B, and dielectric layer 116. In the example of FIG. 3, the substantially resistive dielectric material in dielectric layer 116 has a resistive component, which is represented diagrammatically by resistor 310 in FIG. 3.

To simplify discussion, assume that pole 115A is biased positively and pole 115B is biased negatively to clamp wafer 108 to its top surface. Upon being so biased, electrostatic potential differences begin to build up over a time constant, which may be up to several minutes, between respective regions of dielectric layer 116 that overlies the poles. For example, the bottom surface region 305 of wafer 108, which overlies positively biased pole 115A, will become negatively charged. Analogously, the bottom surface region 307 of wafer 108, which overlies negatively biased pole 115B, will become positively charged. As mentioned earlier, these electrostatic potential differences exert electrostatic forces on the wafer to clamp it to the electrostatic chuck.

Over time, however, electrical charges from the poles tend to redistribute by migrating across substantially resistive dielectric layer 116 (symbolically represented by resistor 310) toward the top surface of dielectric layer 116. By way of example, the positive charges from positively-charged pole 115A will migrate upward through resistive dielectric layer 116 to form a positively biased region 312 in the top surface of dielectric layer 116. Analogously, the negative charges from negatively biased pole 115B will migrate through resistive dielectric layer 116 to form a negatively biased region 314 at the top surface of dielectric layer 116.

With reference to FIG. 3, these regions 305/312 and 307/314 effectively act as capacitive plates across gap 306. As the electrical charges continue to migrate upward through resistive dielectric layer 116, the potential differences across these capacitive plates continue to build up. If the applied clamping voltages are held constant throughout the process duration, the potential differences between these capacitive plates, e.g., between regions 305/312 or 307/314, may be built up to an excessively high level. Such an excessively high level will result in a high field in the gap, which may encourage charge transfer between the chuck to the wafer, thereby decreasing the effective clamping force between the chuck to the wafer.

Further, the presence of a large number of electrical charges in the upper surface of the dielectric layer may significantly increase the amount of time required to satisfactorily remove electrical charges from the electrostatic chuck when processing is completed. Removal of charges is necessary to remove the electrostatic force between the wafer and the chuck in order to declamp the wafer therefrom. The longer declamping time is a consequence of the time constant required for the electrical charges to bleed down across the dielectric layer. The longer declamping time disadvantageously reduces the throughput of the plasma processing system, i.e., reducing the number of wafers that can be processed by a given plasma processing system per unit of time.

In view of the foregoing, there is a need for improved methods and apparatuses for preventing the excessive build up of potential differences between the chuck poles and their respective overlying wafer regions, and for minimizing the declamping time in order to improve the throughput of wafer processing systems.

SUMMARY OF THE INVENTION

The invention relates, in one embodiment, to a control system for controlling a direct current power supply, which supplies direct current voltages to a pole of an electrostatic chuck having a substantially resistive dielectric layer disposed thereon to clamp a wafer to the electrostatic chuck. The control system includes a control circuit electrically coupled to the direct current power supply for causing the direct current power supply to output a build-up voltage having a first polarity during a build-up period. The build-up voltage causes a potential difference to build up between a first region of the substantially resistive dielectric layer and a second region of the wafer that overlies at least a portion of the first region. This potential difference gives rise to a clamping force to clamp the wafer to the electrostatic chuck. The build-up period terminates when the clamping force substantially reaches a predefined level.

The control system includes a control circuit electrically coupled to the direct current power supply for causing the direct current power supply to output a holding voltage during a holding period to substantially maintain the clamping force at the predefined level. The holding voltage has the first polarity and a magnitude that is lower than a magnitude of the build-up voltage.

The control system includes a control circuit electrically coupled to the direct current power supply for causing the direct current power supply to output a declamping voltage during a declamping period to substantially remove the clamping force, the declamping voltage having a polarity that is opposite to the first polarity.

In another embodiment, the invention relates to a method for clamping a wafer to an electrostatic chuck having a substantially resistive dielectric layer disposed thereon. The method includes the step of providing a build-up voltage having a first polarity to a pole of the electrostatic chuck to cause a potential difference to build up between a first region of the substantially resistive dielectric layer and a second region of the wafer that overlies at least a portion of the first region. This potential difference gives rise to a clamping force to clamp the wafer to the electrostatic chuck.

The method further includes the step of terminating the build-up voltage when the clamping force substantially reaches a predefined level. There is further included the step of providing a holding voltage to the pole of the electrostatic chuck to substantially maintain the clamping force at the predefined level. This holding voltage has the first polarity and a magnitude that is lower than a magnitude of the build-up voltage.

These and other advantages of the present invention will become apparent upon reading the following detailed descriptions and studying the various figures of the drawings.

DETAILED DESCRIPTION OF THE PREFERRED EMBODIMENTS

An invention is described herein for preventing the excessive build up of potential differences between the chuck poles and their respective overlying wafer regions, and for minimizing the declamping time in order to improve the throughput of wafer processing systems. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, the wafer is clamped to the electrostatic chuck for the processing duration using two separate clamping d.c. voltages: a build-up voltage and a holding voltage. The build-up voltage is supplied to the electrostatic pole(s) to initially clamp the wafer to the chuck. This build-up voltage preferably has a relatively large magnitude to facilitate rapid migration of electrical charges across the dielectric layer, which has a time constant that is dependent on the potential difference across it. The large magnitude of the build-up voltage advantageously minimizes the time required to satisfactorily clamp the wafer to the electrostatic chuck, i.e., to provide the wafer with adequate cooling.

Once it is determined that an adequate clamping force has been achieved, the build-up voltage is preferably replaced by a holding voltage. The holding voltage preferably has a magnitude that is sufficient to keep the wafer adequately clamped to the chuck, i.e., to keep it adequately cooled, without causing an excessive build up of electrostatic potential differences between the wafer and the chuck or permitting the wafer to be declamped during processing. In one embodiment, the holding voltage is advantageously maintained at a minimum desired level to minimize the amount of charge that is stored in the chuck.

In accordance with another aspect of the present invention, the throughput of plasma processing systems is improved by minimizing the declamping time, i.e., the time required to remove a sufficient amount of electrostatic charges from the electrostatic chuck to permit the wafer to be removed therefrom. In one embodiment, a declamping voltage having a relatively large magnitude but opposite in polarity to the build-up voltage is supplied to the electrostatic chuck during the declamping period. The large magnitude of the declamping voltage facilitates the rapid reverse migration of electrical charges across the dielectric layer and allows electrical charges to be rapidly removed from the chuck. In this manner, declamping time is advantageously minimized to improve the throughput of the wafer processing system.

Figure 4:
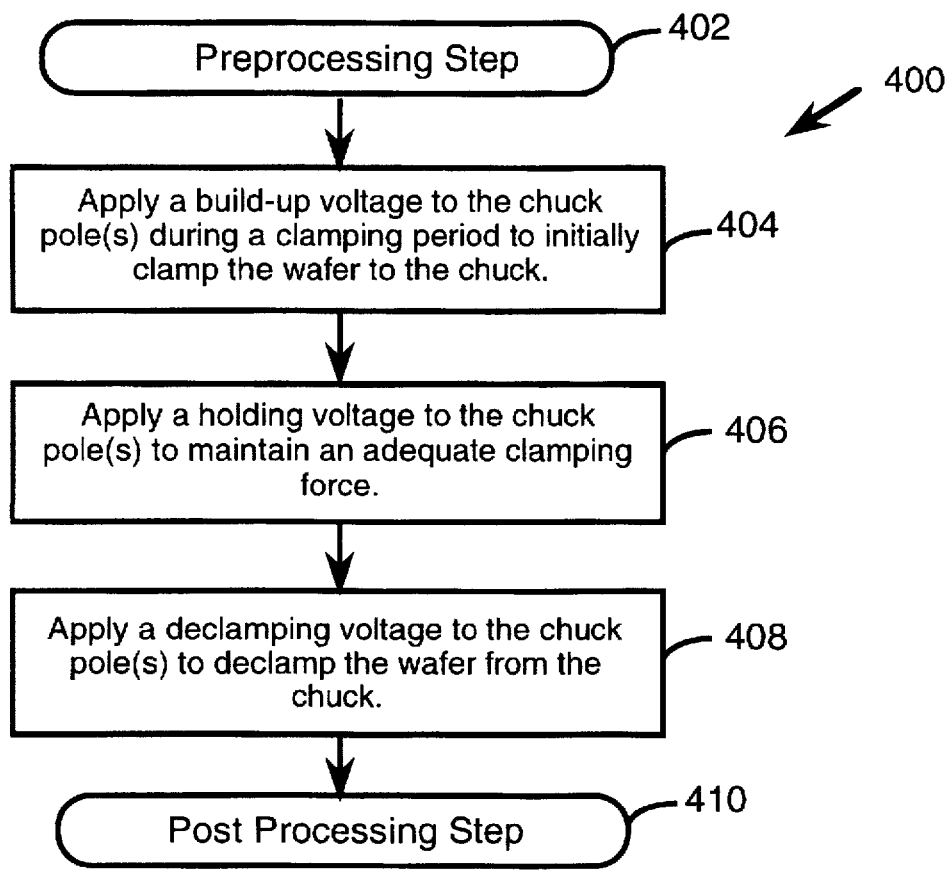
FIG. 4 is a flow chart illustrating the steps for clamping a wafer to and declamping it from an electrostatic chuck in accordance with one embodiment of the present invention.

To discuss the invention in greater detail, FIG. 4 is a flow chart illustrating the steps for clamping a wafer to and declamping it from an electrostatic chuck in accordance with one embodiment of the present invention. In the following discussion, a bipolar chuck is employed to facilitate discussion. It should be noted, however, that the inventive technique also applies to monopolar chucks, which have a single pole and therefore requiring only a single build-up voltage, a single hold voltage level, and a single declamp voltage level.

In step 402, a wafer is prepared for processing in a conventional preprocess step. The pre-process step may include, for example, introducing the wafer into the chamber for processing and positioning it correctly on the electrostatic chuck.

Figure 1:
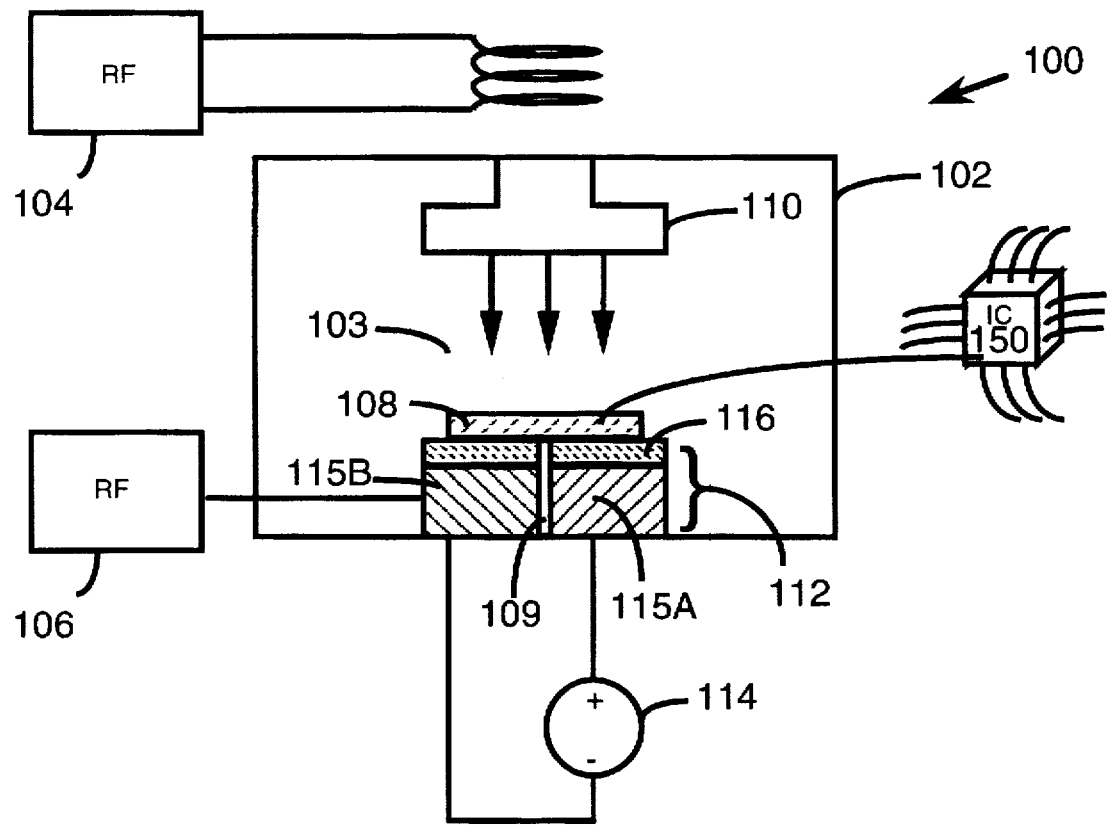
FIG. 1 illustrates an exemplary plasma processing system, representing a wafer processing system which may be adapted for use with the inventive wafer clamping technique.
Figure 2:
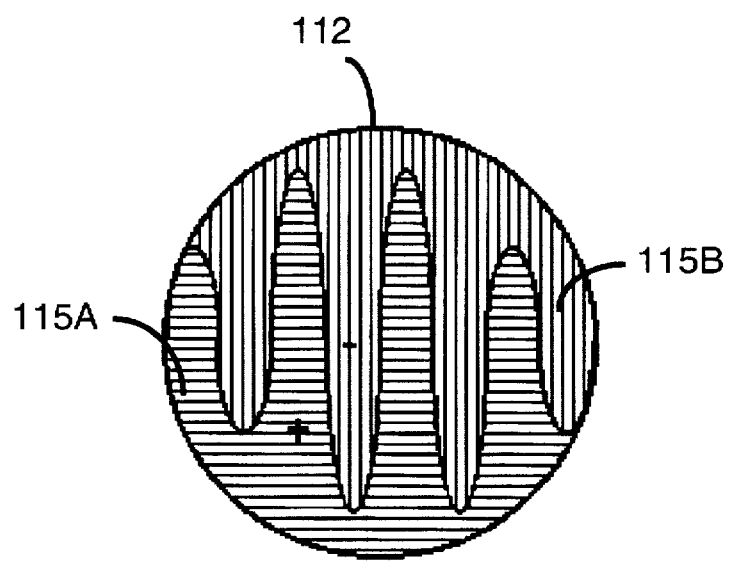
FIG. 2 depicts a bipolar chuck configuration known as an interdigitated configuration.
Figure 3:
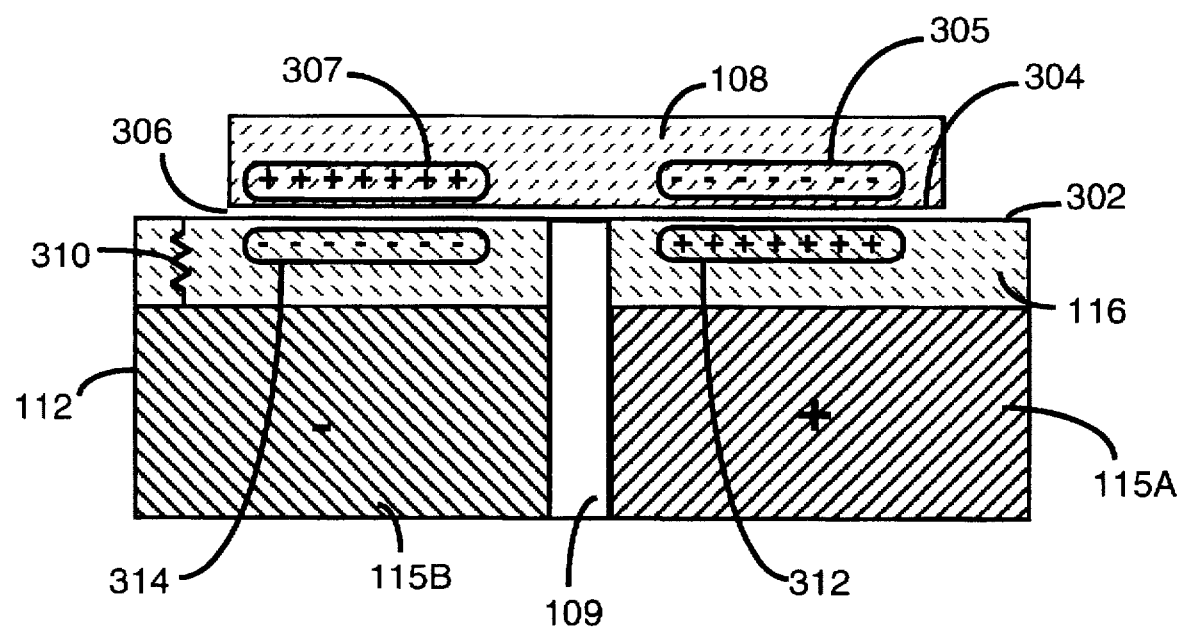
FIG. 3 illustrates in greater detail the wafer and the electrostatic chuck of FIG. 1.

In step 404, build-up voltages are applied to the chuck poles to initially clamp the wafer to the chuck. In one embodiment, the build up voltage is supplied to the chuck as a square wave pulse. With reference to FIG. 1, these build up voltages may be supplied, using an appropriate analog or digital control circuit, from direct current power supply 114. The magnitudes of the build-up voltages are preferably large to create in as short a time period as possible the required electrostatic clamping force between the wafer and the chuck. More preferably, the build-up voltages have greater magnitudes than the magnitudes that are necessary to maintain the clamping force at the desired level. Preferably, this build-up voltage is not too great as to cause overvoltage damage. The magnitude of the required electrostatic clamping force itself varies, depending on the constitution of the dielectric layer, the process, the type of wafer under processing, the wafer cooling requirements, among others. However, the build-up voltages should not have excessively large magnitudes, as this may cause undesirable charge transfer, and may eventually leads to shorts between the wafer and the chuck. Further, the magnitudes of the build-up voltages are preferably kept below the chuck's standoff voltage, e.g., the threshold voltage beyond which damage to dielectric layer 116 occurs.

It should be understood that when the chuck is bipolar, these build-up voltages are supplied to the chuck poles in opposite polarities. Further, it is not required that the build-up voltages of the various poles have the same magnitude. In fact, it may be advantageous in some cases to deliberately skew the magnitudes of the supplied buildup voltages to take into account the d.c. bias of the wafer during processing, i.e., to provide more even electrostatic clamping forces between the various regions of the wafer and the chuck. This is an example of a d.c. bias compensation technique.

Irrespective of their exact magnitudes, the build-up voltages are preferably provided to the chuck poles until the desired clamping force is achieved. In accordance with one aspect of the present invention, the magnitudes of the build-up voltages and the corresponding build-up time for a particular process environment may be ascertained through a combination of calculated estimates and empirical observation. For example, the build-up time may be ascertained by supplying the chuck poles with the lower of the maximum voltages that the power supply can generate and the maximum voltages that do not cause damage to the wafer and/or chuck surface, or for predefined voltages, until the adequate clamping force, i.e., adequate wafer cooling, is achieved.

Upon achieving the desired clamping force, holding voltages are then provided to the chuck poles in step 404. The holding voltages preferably have sufficiently high magnitudes to satisfactorily maintain the required electrostatic clamping force between the wafer and the chuck. Preferably, the magnitudes of the holding voltages should not cause the potential differences between the chuck's poles and their respective overlying wafer regions to become excessively large so as to damage the wafer or the chuck. These holding voltages are preferably provided to the chuck poles for the remaining duration of the process.

The magnitudes of the holding voltages may be empirically ascertained. Optimal application of clamping voltages will result in a constant and adequate clamping force. One method for ascertaining the required magnitudes of suitable holding voltages involves the monitoring of the flow rate of the heat exchange gas, e.g., helium, into the chuck/wafer interface. An excessively high flow rate may indicate that a large amount of heat exchange gas is escaping from the chuck/wafer interface, which may result in inadequate wafer cooling or inadequate holding force between the wafer and the chuck and may be corrected by increasing the electrostatic clamping force, i.e., increasing the magnitudes of the holding voltages. Alternatively, a temperature probe may be employed to monitor or infer the temperature of the wafer itself. An excessively high wafer temperature reading may be corrected by improving the thermal transfer between the wafer and the chuck, i.e., increasing the magnitudes of the holding voltages and the concomitant electrostatic clamping force.

When processing is completed, the electrostatic clamping force is preferably substantially removed to permit the removal of the wafer from the electrostatic chuck. In step 408, the clamping force is removed by applying declamping voltages to the chuck's poles. For a given chuck pole, the declamping voltage preferably has a polarity that is opposite to that of the build-up voltage. In one embodiment, the declamping voltage for a given pole has substantially the same magnitude (albeit opposite in polarity) as the build-up voltage. However, the magnitude of the declamping voltage for a given pole may be larger or smaller than that of the build-up voltage. It is possible to provide a declamping voltage having a magnitude of greater than twice the magnitude of the holding voltage. Preferably, the declamping voltages' magnitudes should be as high as practicable to facilitate the rapid removal of electrostatic charges from the chuck's poles.

Irrespective of their exact magnitudes, the declamping voltages are preferably provided to the chuck poles until the wafer can be satisfactorily removed from the chuck. In accordance with one aspect of the present invention, the magnitudes of the build-up voltages and the corresponding declamping time for a particular process environment are empirically determined in the examples that follow. By way of example, a "pop-off" test may be conducted wherein various declamping voltages are supplied to the poles and measurements are taken of the time it takes for the heat transfer gas to pop the wafer off the chuck. The declamping time may be set to substantially equal this pop-off time or may exceed the pop-off time by a predefined time period, e.g., 2 seconds, to ensure that sufficient charges have been removed from the chuck. Note that the declamping voltages and declamping time may vary from system to system, wafer to wafer, and even process to process (e.g., due to different chuck designs, wafer sizes, heat transfer gas pressures, or the like). Preferably, the declamping time period ends when the potential difference across the gap between the wafer and the dielectric layer is close to zero volts.

In one embodiment, the declamping time is significantly shorter than the buildup time, e.g., 33% shorter in one case, when the declamping voltage has a magnitude that substantially equals the magnitude of the opposite polarity build-up voltage. The advantageously shorter declamping time is a consequence of the high potential difference across dielectric layer during the declamping period, which tends to cause electrical charges to migrate more rapidly from the top surface of the dielectric layer.

In step 410, the wafer may undergo post-processing steps that are conventional in nature. Thereafter, the finished wafer may be cut into dies, which may then be made into IC chips. The resulting IC chip, e.g., IC chips 150 of FIG. 1, may then be incorporated in an electronic device, e.g., any of the commercial or consumer electronic devices, including digital computers.

Figure 5:
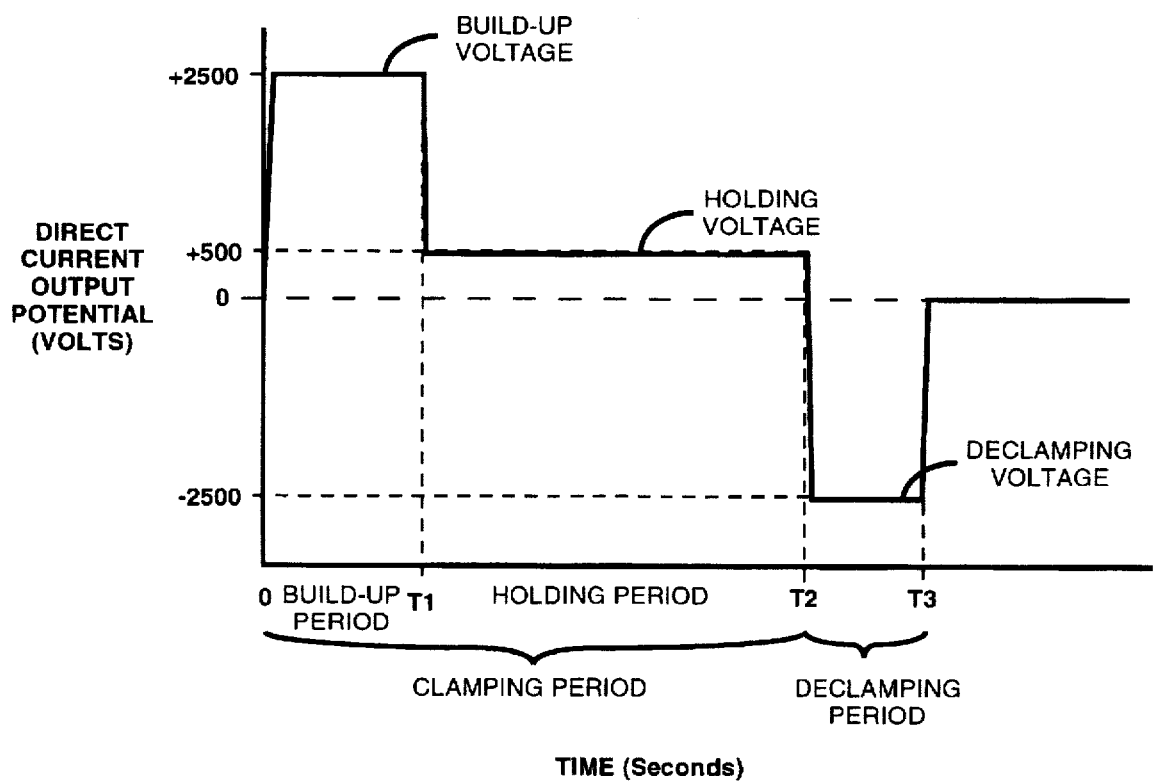
FIG. 5 is a plot of the d.c. potential input into the chuck's positive pole vs. time in accordance with one embodiment of the present invention.

FIG. 5 is a plot of the d.c. potential input into the chuck's positive pole vs. time in accordance with one embodiment of the present invention. To simplify discussion, analogous plot for the chuck's negative pole, which may be a mirror image of the plot of FIG. 5, is not included herein. In this embodiment, a 200 mm wafer is disposed atop a bipolar chuck having equal area electrodes, which is manufactured by Fujitsu of Japan. The wafer and chuck are placed in a TCP (transformer coupled plasma) plasma etch system, which is available from Lam Research Corporation of Fremont, Calif. As mentioned earlier, however, the inventive technique disclosed herein applies to any wafer processing system, whether plasma enhanced or adapted for etching, deposition, oxidation, annodization, or the like.

As shown in FIG. 5, a build-up voltage of about 2,500 volts is applied between poles during the build-up period T1. The build-up voltage is applied substantially as a square wave pulse in one embodiment. The generation of the square wave pulse for creating the build-up voltage is conventional and may be accomplished with, e.g., an op-amp comparator in conjunction with an R.C. circuit. A build-up period T1 of about 16 seconds is experimentally determined to be suitable for a particular etching recipe. It should be borne in mind that these values may vary for different wafers, systems, and process recipes as mentioned earlier.

Once an adequate electrostatic clamping force is achieved, the build-up voltage is replaced by a holding voltage, which is about 500 volts in this embodiment. Note that the holding voltage preferably has the same polarity, albeit at a lower magnitude, as that of the build-up voltage. The holding voltage is preferably supplied for substantially the entire processing duration, represented in FIG. 5 as T2. The duration of the holding period T2 varies depending upon the requirements of a particular process. However, the minimum necessary voltage is preferred as it reduces charge migration across the interface gap, and reduces voltage stress on the chuck dielectric.

Once processing is completed, a declamping voltage is then supplied. In the example of FIG. 5, the declamping voltage has about the same magnitude as that of the build-up voltage, i.e. about 2,500 volts, albeit at an opposite polarity. In one embodiment, the declamping voltage is also applied as a square wave pulse. The relatively high magnitude of the declamping voltage advantageously permits the electrostatic charges to be rapidly removed from the chuck in order to reduce the declamping time and improve the throughput of the plasma processing system. It should be noted that the declamping voltage may have a magnitude that may be larger or smaller than that of the build-up voltage. In this experiment, the declamping time is about 10 seconds. In contrast, prior art methods may require up to 40 seconds to declamp the wafer from the chuck.

Figure 6:
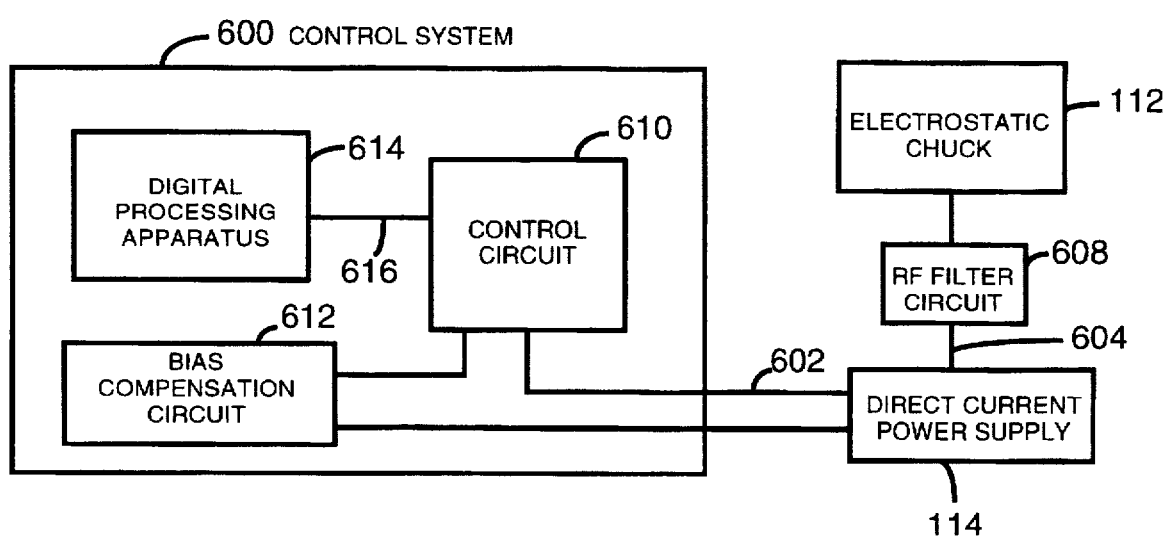
FIG. 6 illustrates, in accordance with one embodiment of the present invention, a plasma processing system having a control circuit suitable for providing the build-up, holding, and declamping voltages of the present invention.

FIG. 6 illustrates, in accordance with one embodiment of the present invention, a plasma processing system having a control circuit suitable for providing the build-up, holding, and declamping voltages of the present invention. Direct current power supply 114, which supplies the d.c. voltages to the chuck's pole(s), is coupled to a control system 600 via line 602. An RF filter circuit 608, which is conventional in construction, is coupled between electrostatic chuck 112 and d.c. power supply 114 to protect d.c. power supply 114 from the radio frequency (RF) energy experienced by the chuck during plasma processing.

Within control system 600, there is provided a control circuit 610, which controls the output voltages of d.c. power supply 114 as well as their duration. Control circuit 610 establishes, among others, the build-up voltage and build-up duration T1, the holding voltage and the holding duration T2, the declamping voltage and the declamp duration T3 (as shown in FIG. 5).

There may be provided a bias compensation circuit 612, which accounts for any d.c. bias induced on wafer 108 by the plasma during processing. Bias compensation circuit 612 may be electrically coupled between control circuit 610 and d.c. power supply 114 to appropriately adjust the outputs of d.c. power supply 114 to account for the aforementioned induced d.c. bias on the wafer. By way of example, such bias compensation circuit may be employed in conjunction with a center-tapped d.c. power supply to keep the potential differences over the poles substantially constant by taking into account the induced wafer bias. If the d.c. power supply is a floating power supply, however, such bias compensation circuit may not be necessary.

Note that the establishment of the build-up voltage and build-up duration T1, the holding voltage and the holding duration T2, as well as the declamping voltage and the declamp duration T3, may be performed by a digital processing apparatus, e.g., a programmable circuit, a microprocessor, or a computer. Via line 616, appropriate signals may be provided by digital processing apparatus 614 to enable control circuit 610 and d.c. power supply 114 to produce at least one the aforementioned voltages for the desired duration.

As can be appreciated from the foregoing, the invention advantageously employs a high voltage to quickly obtain the desired clamping field and the concomitant clamping force. Once the desired clamping force is achieved, the invention advantageously reduces the holding potential to maintain the electric field at the minimum desired level, thereby minimizing the excess charge transfer across the interface gap. In this manner, sticking is substantially reduced.

Further, the maintenance of the electric field at the minimum desired level results in known, reproducible amounts of charge stored on the chuck. Consequently, the stored charge may be removed in a calculated manner to minimize the residual clamping force. Additionally, the invention advantageously employs a high voltage (in opposite polarity) to remove stored charge, thereby minimizing residual sticking as well as the dechucking time to improve wafer throughput.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A control system for controlling a direct current power supply, said direct current power supply supplying direct current voltages to a pole of an electrostatic chuck having a substantially resistive dielectric layer disposed thereon to clamp a wafer to said electrostatic chuck, comprising:

a control circuit electrically coupled to said direct current power supply for causing said direct current power supply to output said direct current voltages at:

a build-up voltage having a first polarity during a build-up period to cause a potential difference to build up between a first region of said substantially resistive dielectric layer and a second region of said wafer that overlies at least a portion of said first region, said potential difference giving rise to a clamping force to clamp said wafer to said electrostatic chuck, said build-up period terminating when said clamping force substantially reaches a predefined level;

a holding voltage during a holding period to substantially maintain said clamping force at said predefined level, said holding voltage having said first polarity and a magnitude that is lower than a magnitude of said build-up voltage, said holding voltage being output during processing of said wafer; and a declamping voltage during a declamping period to substantially remove said clamping force, said declamping voltage having a polarity that is opposite to said first polarity.

2. The control system of claim 1 wherein said clamping force represents an electrostatic force between said wafer and said chuck that is sufficient to stabilize thermal transfer at a predefined level during processing.

3. The control system of claim 1 wherein a magnitude of said declamping voltage substantially equals said magnitude of said build-up voltage.

4. The control system of claim 1 wherein said electrostatic chuck is a bipolar electrostatic chuck.

5. The control system of claim 4 further comprising a bias compensation circuit coupled to said control circuit for adjusting said direct current voltages responsive to an induced direct current bias on said wafer.

6. The control system of claim 1 wherein at least one of said build-up voltage, said holding voltage, and said declamping voltage is generated responsive to signals from a digital processing apparatus coupled to said control circuit.

7. The control system of claim 6 wherein at least one of said build-up period, said holding period, and said declamping period is generated responsive to signals from said digital processing apparatus.

8. The control system of claim 1 wherein said control circuit represents an analog control circuit.

9. The control system of claim 1 wherein said declamping period ends when said potential difference is about zero volt.

10. The control system of claim 1 wherein said build up voltage level is supplied by a substantially square wave pulse.

11. A method for clamping a wafer to an electrostatic chuck having a substantially resistive dielectric layer disposed thereon, comprising:

providing a build-up voltage having a first polarity to a pole of said electrostatic chuck to cause a potential difference to build up between a first region of said substantially resistive dielectric layer and a second region of said wafer that overlies at least a portion of said first region, said potential difference giving rise to a clamping force to clamp said wafer to said electrostatic chuck;

terminating said step of providing said build-up voltage when said clamping force substantially reaches a predefined level; and providing a holding voltage to said pole of said electrostatic chuck to substantially maintain said clamping force at said predefined level, said holding voltage having said first polarity and a magnitude that is lower than a magnitude of said build-up voltage, wherein step of providing the holding voltage is applied during processing of said wafer.

12. The method of claim 11 further comprising the step of providing a declamping voltage to said pole of said electrostatic chuck to substantially remove said clamping force, said declamping voltage having a polarity that is opposite to said first polarity.

13. The method of claim 12 wherein a magnitude of said declamping voltage substantially equals said magnitude of said build-up voltage.

14. The method of claim 12 wherein at least one of said build-up voltage, said holding voltage, and said declamping voltage is generated responsive to signals from a digital processing apparatus coupled to said control circuit.

15. The method of claim 12 wherein at least one of said build-up voltage, said holding voltage, and said declamping voltage is generated responsive to signals from an analog circuit coupled to said control circuit.

16. The method of claim 12 further comprising the step of adjusting at least one of said build-up voltage, said holding voltage, and said declamping voltage responsive to an induced direct current bias on said wafer.

17. The method of claim 11 wherein said clamping force represents an electrostatic force between said wafer and said chuck that is sufficient to facilitate stable thermal transfer at a predefined level during processing.

18. The method of claim 11 wherein said electrostatic chuck is a bipolar electrostatic chuck.

19. The method of claim 11 further comprising the step of terminating said step of providing said declamping voltage when said potential difference is about zero volt.

20. The method of claim 11 wherein said build-up voltage is provided as a substantially square wave pulse.

21. An apparatus for controlling a direct current power supply, said direct current power supply supplying voltages to an electrostatic chuck having a substantially resistive dielectric layer disposed thereon to effect clamping of a wafer to said electrostatic chuck, comprising:

means, coupled to said direct current power supply, for generating a first control signal, said direct current power supply providing, responsive to said first control signal, a build-up voltage having a first polarity to a pole of said electrostatic chuck to cause a potential difference to build up between a first region of said substantially resistive dielectric layer and a second region of said wafer that overlies at least a portion of said first region, said potential difference giving rise to a clamping force to clamp said wafer to said electrostatic chuck;

means, coupled to said direct current power supply, for generating a second control signal, said direct current power supply terminating, responsive to said second control signal, said build-up voltage when said clamping force substantially reaches a predefined level; and means, coupled to said direct current power supply, for generating a third control signal, said direct current power supply providing, responsive to said third control signal, a holding voltage to said pole of said electrostatic chuck to substantially maintain said clamping force at said predefined level, said holding voltage having said first polarity and a magnitude that is lower than a magnitude of said build-up voltage, the holding voltage being provided during processing of said wafer.

22. The apparatus of claim 21 further comprising means, coupled to said direct current power supply, for generating a fourth control signal, said direct current power supply providing, responsive to said fourth control signal, a declamping voltage to said pole of said electrostatic chuck to substantially remove said clamping force, said declamping voltage having a polarity that is opposite to said first polarity.

23. The apparatus of claim 22 wherein a magnitude of said declamping voltage substantially equals said magnitude of said build-up voltage.

24. The apparatus of claim 22 further comprising means, coupled to said direct current power supply, for adjusting at least one of said build-up voltage, said holding voltage, and said declamping voltage responsive to an induced direct current bias on said wafer.

25. The control system of claim 1 wherein the magnitude of said declamping voltage is greater than a magnitude of the holding voltage.

26. The control system of claim 25 wherein said declamping voltage magnitude is greater than twice said magnitude of said holding voltage.

27. The method of claim 12 wherein the magnitude of said declamping voltage is greater than a magnitude of the holding voltage.

28. The method of claim 27 wherein said declamping voltage magnitude is greater than twice said magnitude of said holding voltage.

* * * * *